United States Patent [19]
Moldovan et al.

[11] Patent Number: 4,737,033
[45] Date of Patent: Apr. 12, 1988

[54] ALIGNMENT KEY AND METHOD OF MAKING THE SAME

[75] Inventors: Anton G. Moldovan, East Windsor Township, Mercer County; Frank V. L. Shallcross; Lawrence K. White, both of W. Windsor Township, Mercer County, all of N.J.

[73] Assignee: General Electric Co., Schenectady, N.Y.

[21] Appl. No.: 916,846

[22] Filed: Oct. 7, 1986

[51] Int. Cl.⁴ .............................................. G01B 11/27
[52] U.S. Cl. .................................................... 356/401
[58] Field of Search ...................... 356/399, 400, 401; 250/557

[56] References Cited

U.S. PATENT DOCUMENTS

| | | | |
|---|---|---|---|
| 3,752,589 | 8/1973 | Kobayashi | 356/401 |
| 3,937,579 | 2/1976 | Schmidt | 356/144 |
| 4,232,969 | 11/1980 | Wilczynski | 356/401 |
| 4,356,223 | 10/1982 | Iida et al. | 428/156 |
| 4,422,763 | 12/1983 | Kleinknecht | 356/356 |

*Primary Examiner*—Eugene R. LaRoche
*Assistant Examiner*—David Mis
*Attorney, Agent, or Firm*—Allen LeRoy Limberg; William Squire

[57] ABSTRACT

A substrate includes an alignment key for forming features in or on both surfaces of the substrate which are in alignment with each other. The alignment key includes a plurality of adjacent but spaced apart small openings formed in one surface of the substrate through a P-type region at said one surface and a large opening extending through the substrate from its other surface to the P-type region. The larger opening exposes the smaller openings so that they can be seen from both sides of the substrate. The smaller openings are arranged to form an alignment mark.

13 Claims, 1 Drawing Sheet

ALIGNMENT KEY AND METHOD OF MAKING THE SAME

The present invention relates to an alignment key for use in forming aligned features on a substrate and method of making the same. More particularly, the present invention relates to a key which can be seen from both sides of the substrate to permit forming features on both sides of the substrate which are aligned with each other.

BACKGROUND OF THE INVENTION

Semiconductor devices are made by forming a plurality of features in or on a surface of a substrate using photolithographic techniques. Each feature, when formed, must be aligned with previously formed features. To achieve this alignment, it is the practice to provide an alignment key on the surface of the substrate and corresponding alignment keys on each of the photolithographic masks. When the key on the mask is aligned with the key on the substrate, the features to be formed by the particular mask will be aligned with previously formed features. The alignment of the mask key with the substrate can be achieved either manually by looking at the mask on the substrate through a microscope or with a television camera, or automatically, such as by an apparatus shown in U.S. Pat. No. 4,422,763 to H. P. Kleinknecht, entitled "Automatic Photomask Alignment System For Projecting Printing", issued Dec. 27, 1983.

Semiconductor devices have been developed which include features on both sides of the substrate with the features on one side being aligned with the features on the other side. One technique which has been used to achieve alignment of features on both sides of a substrate has been an alignment apparatus which uses infrared (IR) radiation which passes through the substrate and illuminates both sides of the substrate. However, this has disadvantages when the substrate contains features, such as metal coatings, which are not transparent to IR radiation. Also, this type of apparatus is not easily made compatible with high-resolution, low-defect density projection lithography and suffers from alignment errors resulting from loss of resolution in the IR optical system. Another technique is apparatus which has appropriate optics to see both sides of the substrate simultaneously. This type of apparatus has the disadvantage of being complex and expensive.

SUMMARY OF THE INVENTION

The present invention relates to a key for use in forming features in or on both of opposed surfaces of a substrate, which features are aligned with each other. The key includes a plurality of adjacent but spaced first openings in one surface of the substrate which openings extend part way into the substrate and a larger second opening in the other surface of the substrate and extending through the substrate a distance so as to expose the first openings.

DETAILED DESCRIPTION OF PREFERRED EMBODIMENT

Figure 1:
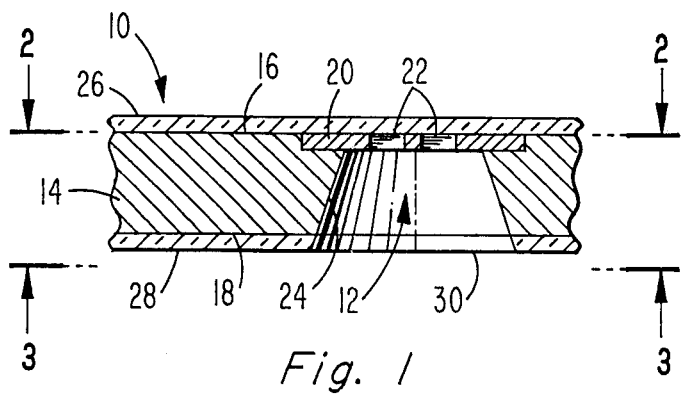
FIG. 1 is a sectional view of a device, such as a semiconductor device, having therein the alignment key of the present invention.

Referring to the drawings, a semiconductor device, generally designated as 10, has therein an alignment key of the present invention, which is generally designated as 12. The semiconductor device 10 includes a substrate 14 of semiconductor material, such as single crystalline silicon, having a pair of opposed major surfaces 16 and 18. Various features can be formed in and on the major surfaces 16 and 18. These features can include regions of different conductivity types to form transistors, diodes and resistors; pattern layers of an insulating material on the surfaces 16 and 18; and pattern layers of a conductive material, such as a metal or conductive polycrystalline silicon.

Figure 2:
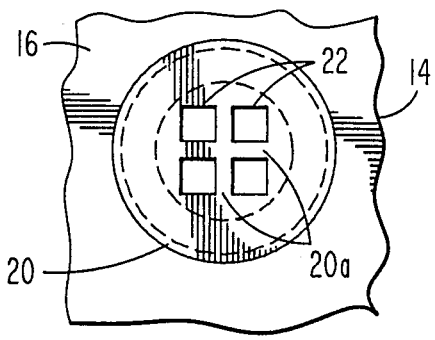
FIG. 2 is a view taken along line 2—2 of FIG. 1.
Figure 3:
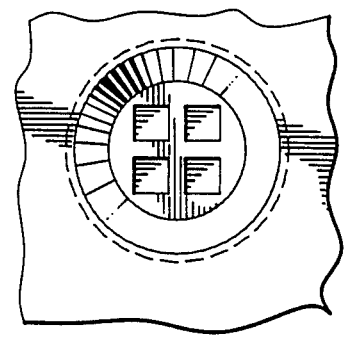
FIG. 3 is a view taken along line 3—3 of FIG. 1.

The key 12 includes a region 20 containing a high concentration of P type conductivity modifiers so as to be highly P type. As shown, the P type region 20 is circular, but it can be of any desired shape. The depth of the P type region 20 is not critical. A plurality of first openings 22 extend through the P type region 20 from the substrate surface 16. As shown in FIGS. 2 and 3, each of the first openings 22 is in the form of a square and the first openings 22 are arranged in adjacent but spaced relation in two rows and two columns so as to be arranged in a square. Thus, the portions 20a of the P type region 20 between the first openings 22 are in the form of a cross, which is a common configuration for an alignment key. However, only a single opening 22 is required if a plurality of spaced keys are provided on a substrate. Also, the openings 22 can be in any other form which results in a suitable alignment key configuration. A second opening 24 extends through the substrate 14 from the surface 18 to the P type region 20. The second opening 24 is preferably circular but may be rectangular or square in transverse cross section and has a tapered outer wall so that its area at the P type region 20 is smaller than its area at the surface 18. The area of the second opening 24 at the P type region 20 is small enough so that it does not extend beyond the edge of the P type region 20 but large enough to expose the openings 22. Thin layers 26 and 28 of silicon oxide are on the surfaces 16 and 18 respectively of the substrate 14. The silicon oxide layer 26 extends across the P type region 20 and the first openings 22. The silicon oxide layer 28 has an opening 30 therethrough in alignment with the second opening 24.

Figure 4:
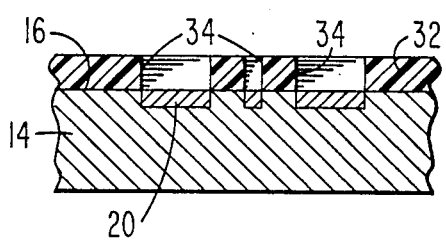
FIGS. 4–6 are sectional views illustrating a method of making the alignment key.

The alignment key 12 may be formed in the semiconductor device 10 by first coating the surface 16 of the substrate 14 with a layer 32 of a photoresist as shown in FIG. 4. Using standard photolithographic techniques, the photoresist layer 32 is provided with openings 34 therethrough over the area of the substrate surface 16 where the P type region 20 is to be formed. Ions of a P type conductivity modifier, such as boron ions, are then embedded in the exposed area of the substrate surface 16, such as by ion implantation, to form the P type region 20. The photoresist layer 32 is then removed with a suitable solvent. The P-type region 20 can also be formed by diffusion using a diffusion mask, such as silicon oxide, instead of a photoresist mask.

Figure 5:
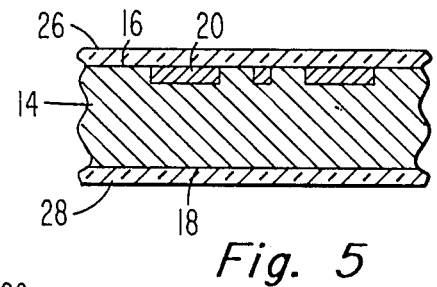
Figure 6:
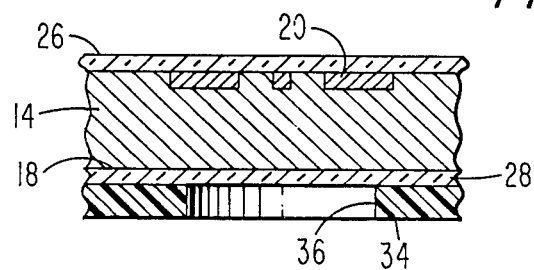

As shown in FIG. 5, the silicon oxide layers 26 and 28 are then formed on the substrate surfaces 16 and 18. This is achieved by heating the substrate 14 in an atmosphere of oxygen or water vapor. As shown in FIG. 6, a layer 34 of photoresist is then applied over the silicon oxide layer 28. Using standard photolithographic techniques, the photoresist layer 34 is provided with an opening 36 therethrough over the area of the silicon oxide layer 28 where the opening 30 is to be provided. The exposed area of the silicon oxide layer 28 is then removed with a suitable etchant, such as buffered hydrofluoric acid, or by plasma etching, to form the opening 30 and expose an area of the substrate surface 18. The exposed area of the substrate surface 18 is then anisotropically etched, such as by an aqueous solution of potassium hydroxide and n-propanol. The etching is carried out to etch the second opening 24 completely through the substrate 14 to the P type region 20 and then through the openings in the P type region 20 to form the first openings 22. Because of the high doping concentration in the P type region 20, the etchant will not etch away any significant portion of the P type region 20 while etching the first openings 22 therethrough. The photoresist layer 34 can then be removed with a suitable solvent.

In forming a semiconductor device in the substrate 14 using the alignment key 12, various features of the semiconductor device can be formed in or on the substrate surface 18 using the cross formed by the portions 20a of the P type region which can be seen directly through the second opening 24. Thus, all of the features formed in or on the substrate surface 18 will be aligned with each other by means of the alignment key 12. Features can also be formed in or on the substrate surface 16 by using the cross formed by the portions 20a of the P type region by viewing it directly through the silicon oxide layer 26 which is transparent to normal light. Thus, the features formed on the substrate surface 16 will also be aligned with each other by means of the alignment key 12. Since the features formed in or on each of the substrate surfaces 16 and 18 are aligned with each other by means of the same alignment key 12, the features on or in the surface 16 will also be aligned with the features formed in or on the substrate surface 18. Since the alignment of features formed in or on both of the substrate surfaces 16 and 18 is achieved by directly viewing the same alignment key 12, the alignment of the various masks used to form the features can be achieved using standard photolithographic alignment equipment which is normally used to align features formed on only a single surface of a substrate. Thus, the alignment key 12 of the present invention provides for alignment of features formed in or on both surfaces of a substrate using standard alignment equipment.

We claim:

1. In a device which includes a substrate having opposed major surfaces, an alignment key for use in forming features in or on both of said surfaces of the substrate, said key comprising
at least one opening in one of said substrate surfaces extending partially into said substrate, and a larger second opening in the other substrate surface extending through the substrate a distance so as to expose said first opening.

2. A device in accordance with claim 1 including a highly doped P type region in said substrate at said one surface and the first opening is in and through said P-type region.

3. A device in accordance with claim 2 in which said second opening extends to said P type region and the wall of said second opening is within the outer edge of said P-type region.

4. A device in accordance with claim 3 in which said second opening is a symmetrical geometric figure rectangular and has an area at the P-type region large enough to expose the first opening and small enough not to extend beyond the edge of the P-type region.

5. A device in accordance with claim 4 including a plurality of spaced openings through said P-type region and the second opening exposes all of said first openings.

6. A device in accordance with claim 5 including four first openings in adjacent but spaced relation and arranged in two rows and two columns so that the portion of the P-type region between the first openings forms a cross.

7. A device in accordance with claim 6 in which each of the first openings is a square.

8. A device in accordance with claim 3 including a separate layer of silicon oxide on each of said substrate surfaces, the silicon oxide layer on the one surface extending over the P-type region and the first openings and the silicon oxide layer over the other substrate surface having an opening therethrough in alignment with the second opening.

9. A method of making an alignment key in a substrate having opposed surfaces comprising the steps of
(a) forming in said substrate at one of said surfaces a region of P type conductivity which region has at least one opening therethrough which contains material of said substrate,
(b) etching an opening through said substrate from the other surface to said P type region, and
(c) removing the material of the substrate in the opening in the P type region to form an alignment mark which is visible from both sides of the substrate.

10. A method in accordance with claim 9 in which the material is removed from the opening in the P type region by a continuation of the etching of the opening through the substrate.

11. A method in accordance with claim 10 in which prior to etching the opening through the substrate a layer of silicon oxide is formed over both surfaces of said substrate and an opening is formed in the silicon oxide layer on the other surface where the opening is to be etched.

12. A method in accordance with claim 11 wherein the P-type region is formed with a plurality of openings therethrough.

13. A method in accordance with claim 12 in which the P type region is formed with four openings therethrough arranged in two rows and two columns so that the alignment mark formed by removing the semiconductor material from said openings is a cross.

* * * * *